US 6,627,536 B1

(12) United States Patent
Gabriel (10) Patent No.: US 6,627,536 B1
(45) Date of Patent: Sep. 30, 2003

(54) SEMICONDUCTOR BLOCKING LAYER FOR PREVENTING UV RADIATION DAMAGE TO MOS GATE OXIDES

(75) Inventor: Calvin Todd Gabriel, Cupertino, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/795,680

(22) Filed: Feb. 27, 2001

Related U.S. Application Data

(62) Division of application No. 09/315,596, filed on May 20, 1999.

(51) Int. Cl.⁷ ................ H01L 21/4763; G03C 1/815; G03C 1/825
(52) U.S. Cl. .............. 438/634; 438/636; 430/512
(58) Field of Search ................ 438/636, 622, 438/618, 634; 430/512

(56) References Cited

U.S. PATENT DOCUMENTS

| | | | | | |
|---|---|---|---|---|---|
| 4,557,797 A | * | 12/1985 | Fuller et al. | ............... | 156/643 |
| 4,610,771 A | * | 9/1986 | Gillery | ............... | 204/192 |
| 4,786,609 A | * | 11/1988 | Chen | ............... | 437/30 |
| 5,302,538 A | * | 4/1994 | Ishikawa et al. | ............... | 156/643 |
| 5,472,829 A | * | 12/1995 | Ogawa | ............... | 430/325 |
| 5,510,278 A | * | 4/1996 | Nguyen et al. | ............... | 437/40 |
| 5,525,542 A | * | 6/1996 | Maniar et al. | ............... | 437/186 |
| 5,529,524 A | * | 6/1996 | Jones | ............... | 445/24 |
| 5,541,139 A | * | 7/1996 | Rijpers et al. | ............... | 437/209 |
| 5,591,566 A | * | 1/1997 | Ogawa | ............... | 430/325 |
| 5,619,097 A | * | 4/1997 | Jones | ............... | 313/495 |
| 5,677,111 A | * | 10/1997 | Ogawa | ............... | 430/313 |
| 5,707,883 A | * | 1/1998 | Tabara | ............... | 437/40 |
| 5,733,712 A | * | 3/1998 | Tanaka et al. | ............... | 430/314 |
| 5,846,693 A | * | 12/1998 | Tanaka | ............... | 430/311 |
| 5,935,765 A | * | 8/1999 | Tanaka | ............... | 430/315 |
| 5,994,157 A | * | 11/1999 | Aggas et al. | ............... | 438/30 |
| 6,162,588 A | * | 12/2000 | Tanaka | ............... | 430/318 |
| 6,297,170 B1 | * | 10/2001 | Gabriel et al. | ............... | 438/738 |

FOREIGN PATENT DOCUMENTS

| | | | | |
|---|---|---|---|---|
| EP | 0448862 A2 | * | 2/1981 | ............... 1/133 |
| JP | 356014221 | * | 2/1981 | ............... 1/133 |
| JP | 406180456 | * | 6/1994 | ............... 349/155 |

* cited by examiner

Primary Examiner—Ngân V. Ngô
Assistant Examiner—Shrinivas H. Rao
(74) Attorney, Agent, or Firm—Peter Zawilski (57) ABSTRACT

A system and apparatus is provided for preventing damage to gate oxide due to ultraviolet radiation associated with semiconductor processes. Included is a substrate and a gate formed on the substrate. The gate includes a gate material layer and a gate oxide layer stacked on the substrate. A pair of spacers are situated on opposite sides of the gate. Deposited over the gate and the spacers is an ultraviolet radiation blocking material for preventing the ultraviolet radiation from damaging the gate oxide layer of the gate. Finally, at least one metal and intermetal oxide layer is positioned over the ultraviolet radiation blocking material. In an alternate embodiment, instead of the ultraviolet radiation blocking material being deposited over the gate and the spacers, the spacers are constructed from an ultraviolet radiation blocking material for preventing the ultraviolet radiation from damaging the gate oxide layer of the gate.

17 Claims, 10 Drawing Sheets

SEMICONDUCTOR BLOCKING LAYER FOR PREVENTING UV RADIATION DAMAGE TO MOS GATE OXIDES

This is a division of Ser. No. 09/315,596, filed May 20, 1999.

BACKGROUND OF THE INVENTION

This invention relates generally to semiconductor processing and, more particularly to a method and apparatus for preventing damage to gate oxide due to ultraviolet radiation associated with semiconductor processes.

Figures 1A, 1A:
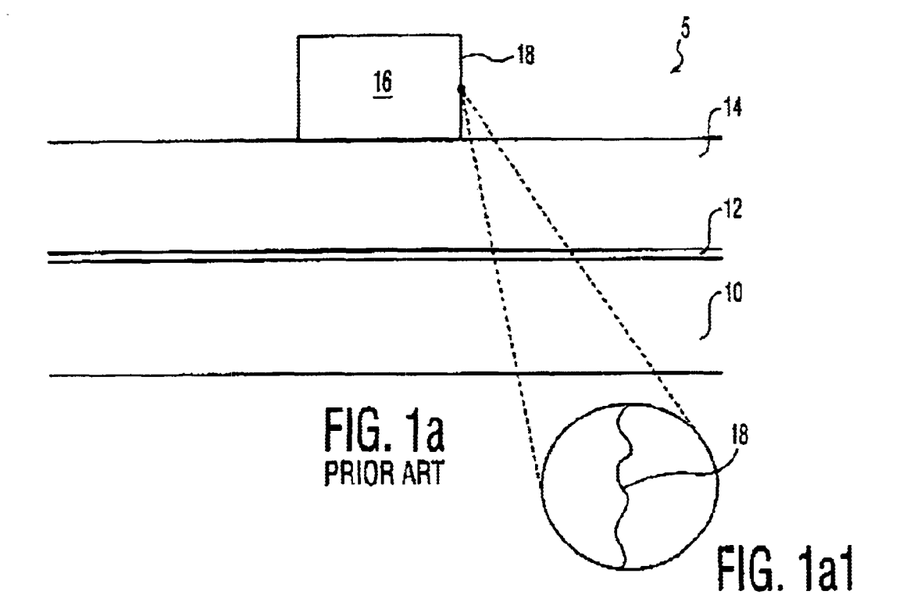
FIG. 1a is a highly exaggerated cross-sectional view of a semiconductor stack with photoresist that is patterned without an ultraviolet (UV) absorbing layer. Also shown is a detailed view of a side wall of the patterned photoresist which is non-uniform due to the absence of the UV absorbing layer.

In the manufacture of semiconductors, ultraviolet (UV) radiation is encountered during various related processes. For example, UV radiation plays a prominent role during the construction of a gate on a conventional substrate. As shown in Prior Art FIG. 1a, a stack 5 including a silicon layer 10, an oxide layer 12, and a polysilicon layer 14 is etched by first applying a photoresist layer 16 thereon. This photoresist layer 16 is subsequently patterned by being exposed to UV radiation.

During the patterning of the photoresist layer 16, the UV radiation tends to reflect off the polysilicon layer 14. This reflection in turn leads to constructive interference that results in side walls 18 of the patterned photoresist layer 16 becoming non-linear. This non-linearity of the side walls 18 of the patterned photoresist layer 16 is undesirable since it tends to lead to non-uniform etching later. See the detailed view of Prior Art FIG. 1a.

Figures 1B, 1B:
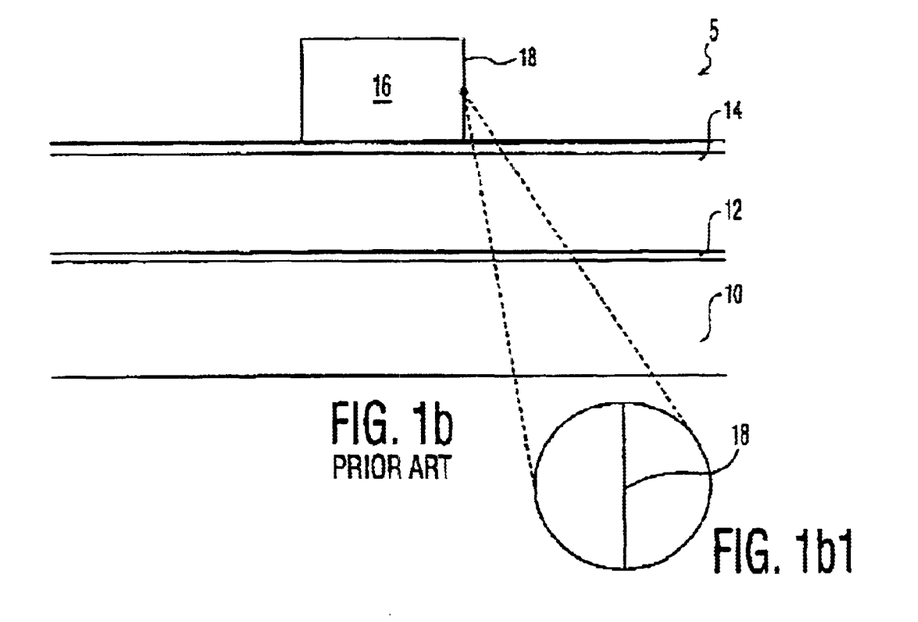
FIG. 1b is a highly exaggerated cross-sectional view of a semiconductor stack with photoresist that is patterned on a UV absorbing layer. Also shown is a detailed view of a side wall of the patterned photoresist which is uniform as a result of the incorporation of the UV absorbing layer.
Figure 1C:
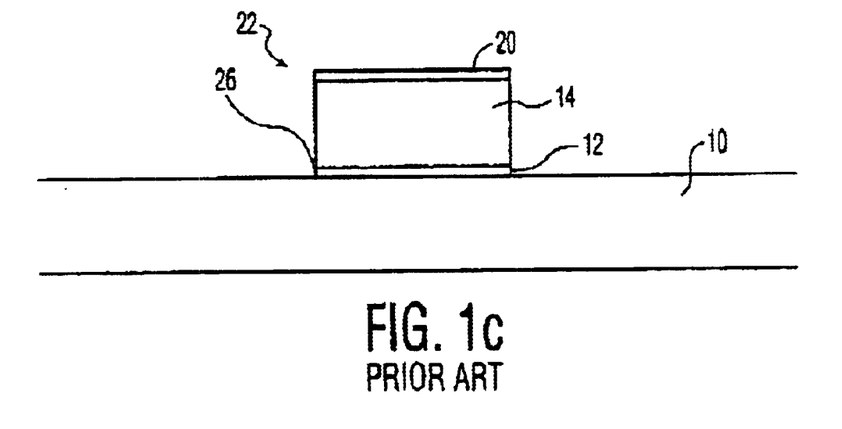
FIG. 1c is a highly exaggerated cross-sectional view of a gate that is formed after the semiconductor stack of FIG. 1b is etched and the photoresist is removed.

To combat this problem, a UV absorbing layer 20, i.e. SiON, may be deposited on the polysilicon layer 14 prior to applying the photoresist layer 16. Note Prior Art FIG. 1b. Such UV absorbing layer 20 serves to absorb the UV radiation thus precluding reflection and thereby improving the linearity of the patterning, as shown in the detailed view of Prior Art FIG. 1b. As shown in Prior Art FIG. 1c, with the patterned photoresist layer 16 in place, the stack 5 may be etched to form a gate 22.

Yet another semiconductor process that produces UV radiation is etching. Specifically, UV radiation is an inherent byproduct of plasma that is used during the process of etching. It should be noted that UV radiation generated during etching is undesirable for a reason much different from that associated with patterning photoresist, as mentioned hereinabove. During etching, UV radiation is undesirable due to the adverse affects on the gate oxide layer 12. In particular, UV radiation damages the gate oxide layer 12 to the extent of increasing the probability of device failure in the resulting integrated circuit.

Figure 1D:
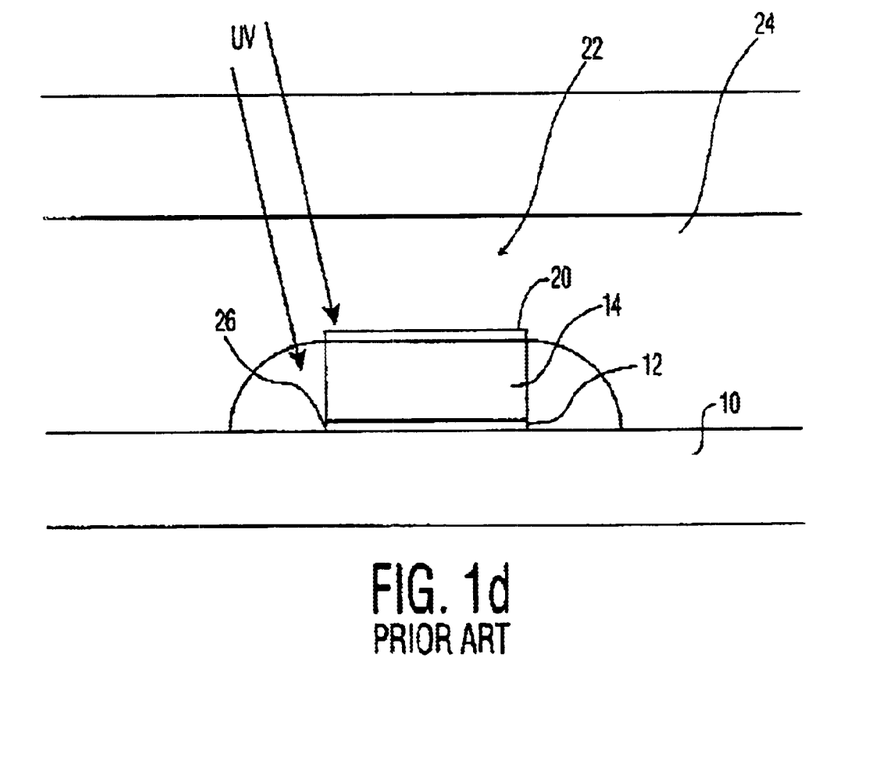
FIG. 1d is a highly exaggerated cross-sectional view of the semiconductor stack of FIG. 1c after metal and intermetal oxide (IMO) layers are applied, wherein only partial protection of the gate oxide layer is afforded against UV radiation during plasma etching.

In the past, the remnants of the UV absorbing layer 20 associated with patterning photoresist have been relied upon to protect the gate oxide layer 12 in a manner shown in Prior Art FIG. 1d. It is thus fortuitous that the UV absorbing layer 20, which was required earlier for different reasons, is now useful in absorbing UV radiation that would otherwise damage the gate oxide layer 12. As will become apparent later, however, such UV absorbing layer 20 fails to completely protect the gate oxide layer 12 from the UV radiation.

While the amount of etching-related UV radiation reaching the gate oxide layer has been considered acceptable in the past, this is no longer the case in view of the recent use of thinner gate oxides and high density plasma during the etching process. Associated with such use of high density plasma is greater amounts of UV radiation that in turn inflict more damage on the gate oxide layer 12. This augmented UV radiation has the potential of more easily penetrating the various layers of the stack 5 and causing damage to exposed areas of the gate oxide layer 12.

To put the severity of the present trend in perspective, a historical comparison may be made in relation to gate oxide failure due to other causes. In the past, UV radiation-related device failure has been considered low with respect to device failure due to the gate oxide layer 12 being subject to charging. Accordingly, much time and effort has been contributed to charge damage protection, as oppose to protection against UV radiation. This is due mainly to the contention that standard intermetal oxide (IMO) layers 24 and the aforementioned remnants of the UV absorbing layer 20 offered sufficient protection against UV radiation. For example, given an IMO thickness of 2 $\mu$m, only about 38% of surface UV radiation reaches the gate oxide layer 12.

Figure 1E:
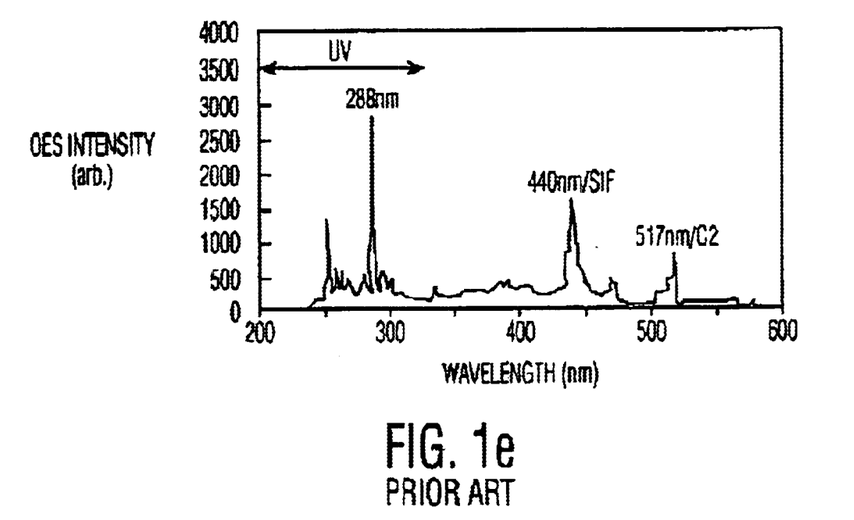
FIG. 1e is a graph of the optical emissions spectrometer (OES) intensity associated with high density plasma in terms of wavelength.

However, studies indicate that failure due to exposure of the gate oxide layer 12 to UV radiation has become increasingly prominent with the emerging use of high density plasmas. As shown in Prior Art FIG. 1e, it is shown that optical emissions spectrometer (OES) intensity associated with high density plasma peaks at wavelengths in the UV range. It has been shown that UV radiation associated with such high density plasma has been sufficient to overcome the protection afforded by standard IMO layer 24 and the UV absorbing layer 20 to bring rise to increased device failure.

This problem is compounded by the fact that the gate oxide layer 12 is exposed, and therefore more susceptible to UV radiation at edges 26 of the gate 22. UV radiation from high density plasma can thus reach the edges 26 of the gate oxide layer 12 with greater ease.

Figure 1F:
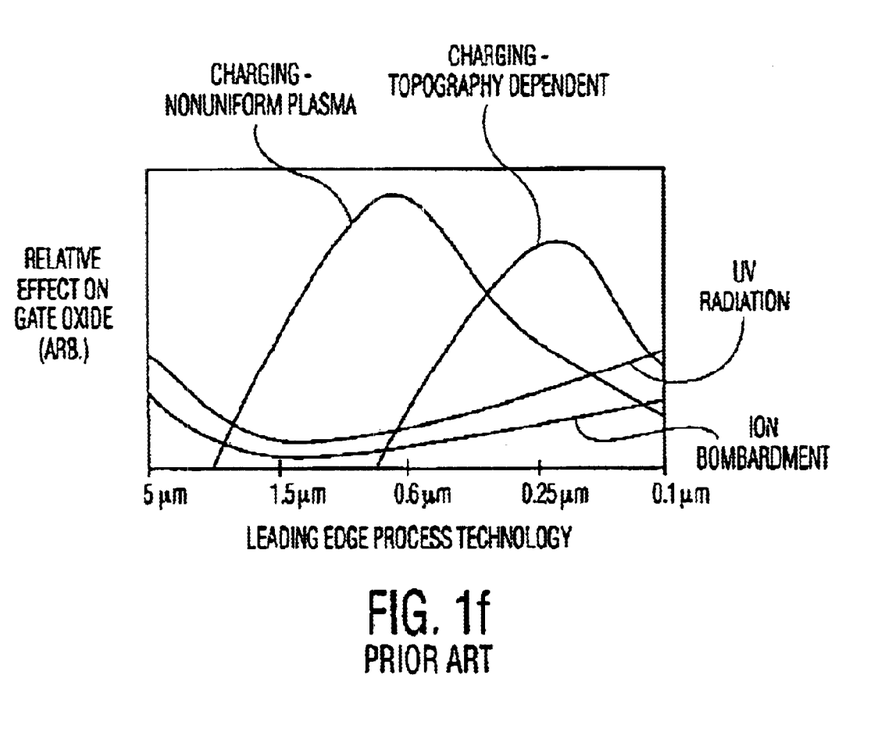
FIG. 1f is a graph comparing the relative effects of both charging and UV radiation on a gate oxide layer in leading edge process technology.

This increase in device failure caused by UV radiation has thus become comparable to the previously dominant charge-related device failure. Prior Art FIG. 1f depicts this relationship between the affects of UV radiation and charging on gate oxide layer 12. As shown, effects of UV radiation are increasingly important and even become the dominating factor in processes dealing with leading edge technology, i.e. ≈0.1 $\mu$m.

Figure 1G:
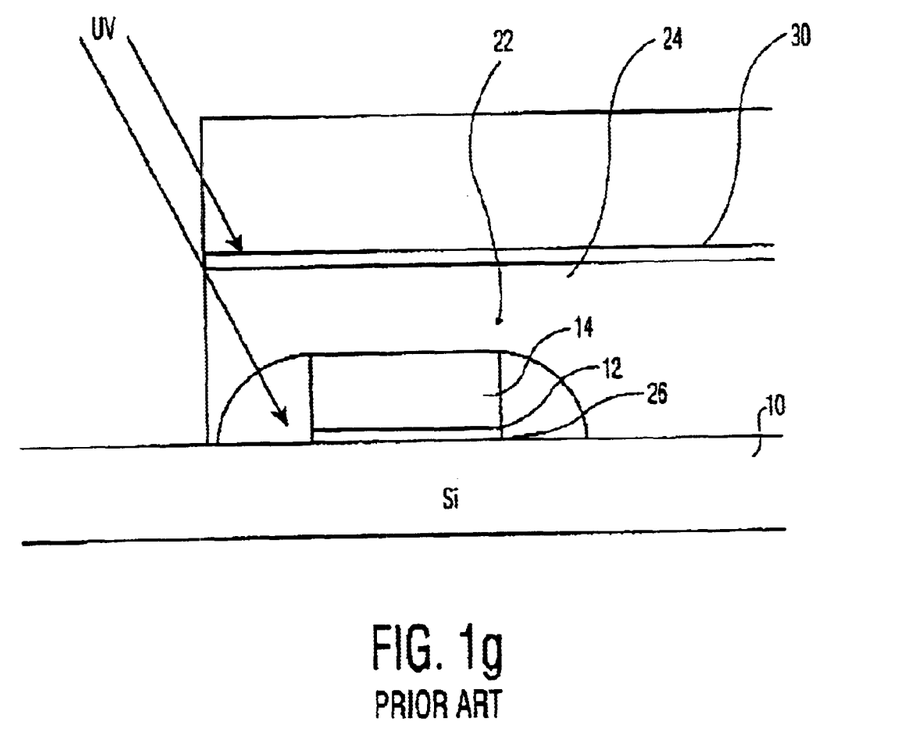
FIG. 1g is a highly exaggerated cross-sectional view of a semiconductor stack after metal and IMO layers are applied, wherein a UV absorbing layer is applied on top of the IMO layer for protecting the gate oxide layer against UV radiation during plasma etching.

To address this emerging trend, various methods have been established to combat the negative effects of UV radiation on gate oxides. Prior Art FIG. 1g shows a cross-sectional view of a gate 22 with IMO layer 24 thereon. In addition to such conventional structure, a UV absorbing layer 30 is disposed on top of the IMO layer 24. In such position, the UV absorbing layer 30 may be better suited to prevent damage to the gate oxide layer 12. As shown in Prior Art FIG. 1g, however, UV radiation is still permitted to access the gate oxide layer 12 and therefore damage the gate oxide layer 12, especially after etching is carried out.

There is thus a need for a method and apparatus for further preventing damage to a gate oxide layer of a semiconductor stack that results from UV radiation associated with semiconductor plasma etching, wherein such protection is afforded particularly in the proximity of the edges of the gate oxide layers.

As set forth hereinabove, protection against UV radiation may be afforded by the incorporation of a UV-absorbing material on top of the IMO layer. Such material is known to take the form of SiN or SiON. While partially effective, stoichiometric SiN and SiON still leave much to desire in terms of protection of gate oxides against UV radiation.

There is thus a need for a material that prevents UV radiation-related damage to a gate oxide layer of a semiconductor stack in a more effective manner.

SUMMARY OF THE INVENTION

A system and apparatus is provided for preventing damage to gate oxide due to ultraviolet (UV) radiation associated with semiconductor processes. Included is a substrate and a gate formed on the substrate. The gate includes a gate material layer and a gate oxide layer positioned on the substrate. A pair of spacers are situated on opposite sides of the gate. Deposited over the gate and the spacers is a UV radiation blocking material for preventing the UV radiation from damaging the gate oxide layer of the gate. Finally, at least one metal and intermetal oxide layer is positioned over the UV radiation blocking material.

In another embodiment, instead of the UV blocking material being deposited over the gate and the spacers, the spacers are constructed from the UV radiation blocking material for preventing the UV radiation from damaging the gate oxide layer of the gate. In such embodiment, the UV radiation blocking material serves as both an insulating layer between the gate and upper layers of the semiconductor stack, and further protects the gate oxides against UV radiation associated with plasma etching.

Yet another embodiment of the present invention addresses the need for additional materials to use as protection against damage to gate oxides during semiconductor processes. In particular, the present invention offers a plurality of materials which more effectively protect gate oxides against UV radiation associated with semiconductor processes.

These and other advantages of the present invention will become apparent upon reading the following detailed description and studying the various figures of the drawings.

BRIEF DESCRIPTION OF THE DRAWINGS

Prior Art

Prior Art

Prior Art

Prior Art

Prior Art

Prior Art

Prior Art

DETAILED DESCRIPTION OF THE PREFERRED EMBODIMENTS

FIGS. 1a–1g illustrate the prior art. With reference now to FIGS. 2–7, one embodiment of the present invention includes a semiconductor device 100 adapted for preventing damage to gate oxide due to ultraviolet (UV) radiation associated with semiconductor processes. As shown in FIG. 3e, included is a substrate 102, a gate 104, a pair of spacers 106, a UV radiation blocking material 108, and at least one metal and intermetal oxide layer 110. It should be noted that the intermetal oxide layer also refers to any type of interlayer dielectric.

Figure 2:
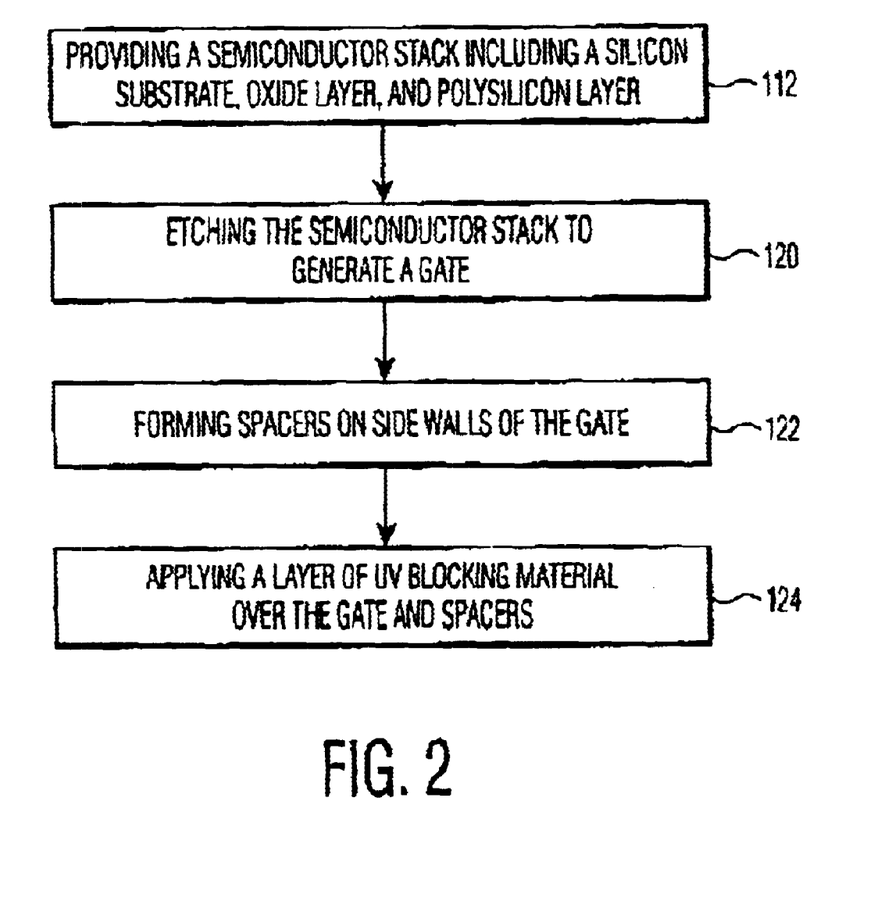
FIG. 2 is a flowchart delineating the method associated with one embodiment of the present invention, wherein a UV absorbing layer is applied to the gate prior to placement of the metal and intermetal oxide layers.
Figure 3A:
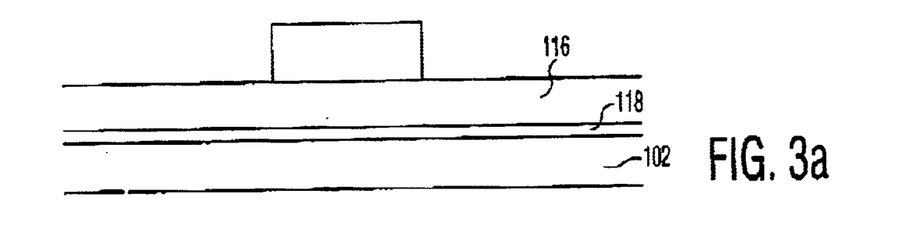
FIG. 3a is a highly exaggerated cross-sectional view of a semiconductor stack with photoresist that is patterned prior to etching, in accordance with the embodiment of the present invention set forth in FIG. 2.
Figure 3B:
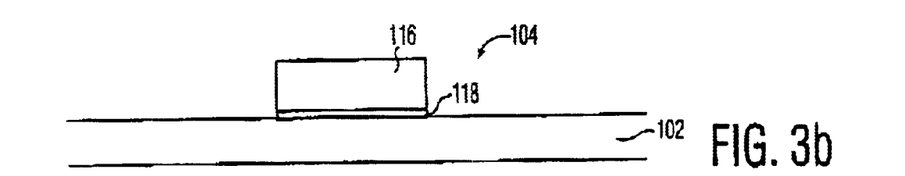
FIG. 3b is a highly exaggerated cross-sectional view of the semiconductor stack of FIG. 3a after etching and removal of the photoresist, wherein a gate is formed in accordance with the embodiment of the present invention set forth in FIG. 2.
Figure 3C:
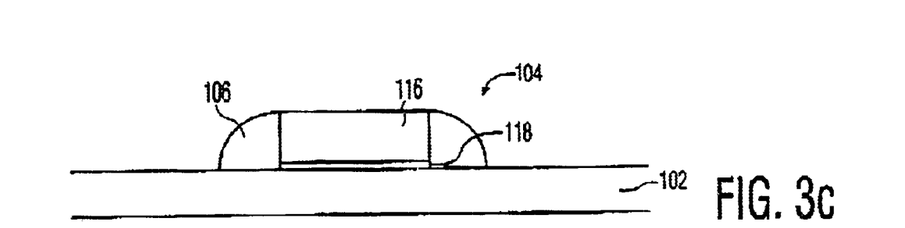
FIG. 3c is a highly exaggerated cross-sectional view of the semiconductor stack of FIG. 3b, wherein a pair of spacers are formed adjacent the gate in accordance with the embodiment of the present invention set forth in FIG. 2.
Figure 3D:
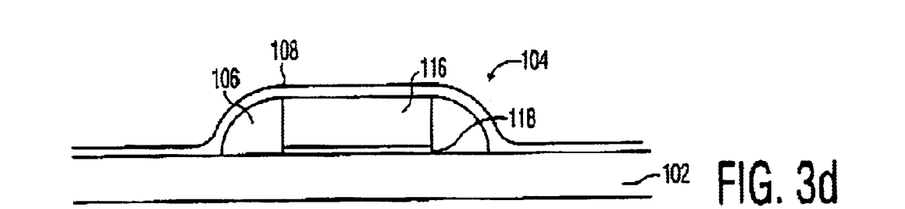
FIG. 3d is a highly exaggerated cross-sectional view of the semiconductor stack of FIG. 3c, wherein a UV blocking layer is applied over the gate and spacers in accordance with the embodiment of the present invention set forth in FIG. 2.
Figure 3E:
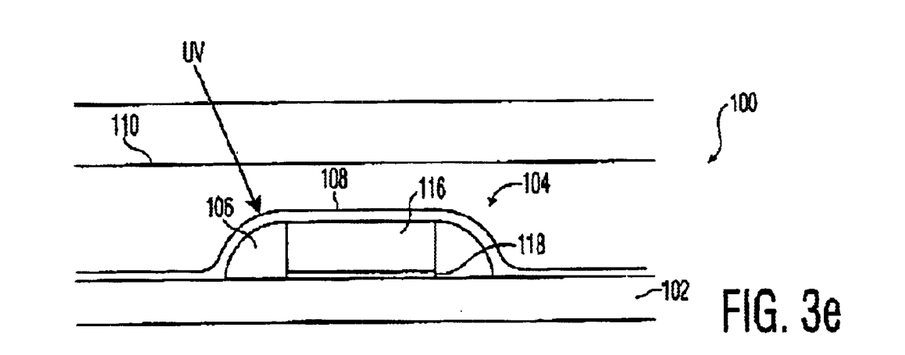
FIG. 3e is a highly exaggerated cross-sectional view of the semiconductor stack of FIG. 3d, wherein metal and intermetal oxide layers are applied over the UV blocking layer in accordance with the embodiment of the present invention set forth in FIG. 2.

As shown in FIG. 2, a method is set forth for manufacturing the semiconductor device 100 of the present invention shown in FIG. 3e. As indicated in operation 112 of FIG. 2, a substrate 102 is provided on which a gate material layer 116 and a gate oxide layer 118 are positioned. It should be noted that the gate material layer may include, but is not limited to polysilicon, amorphous silicon, tungsten silicide, and/or any other gate material capable of affording desired integrated circuit operation. As shown in FIG. 3a, in preparation of the formation of the gate 104, a photoresist layer 119 is applied to the gate material layer 116 and subsequently patterned.

Etching is then performed to generate the gate 104 that is shown in FIG. 3b, as indicated in operation 120 of FIG. 2. In accordance with conventional practices in the semiconductor manufacturing arts, a pair of spacers 106 are positioned on opposite sides of the gate 104 for insulation purposes, as indicated in operation 122 of FIG. 2. Note FIG. 3c.

With continuing reference to FIG. 2, a UV radiation blocking material 108 is deposited directly over and in contact with the gate 104 and the spacers 106 in operation 124. Note FIG. 3d. Once the UV blocking material 108 has been applied, at least one metal and intermetal oxide layer 110 may be deposited over the UV radiation blocking material 108. As shown in FIG. 3e, the UV radiation blocking material 108 serves for preventing the UV radiation from damaging the gate oxide layer 118 of the gate 104 during later patterning and etching processes.

Figure 5A:
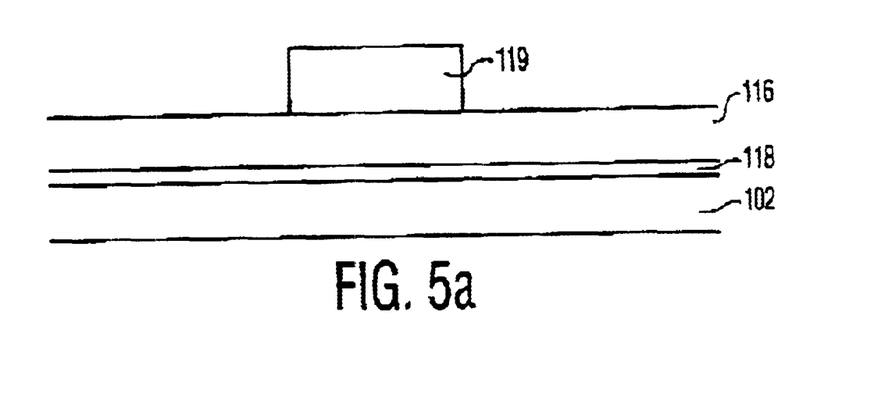
FIG. 5a is a highly exaggerated cross-sectional view of a semiconductor stack with photoresist that is patterned prior to etching, in accordance with the embodiment of the present invention set forth in FIG. 4.
Figure 5B:
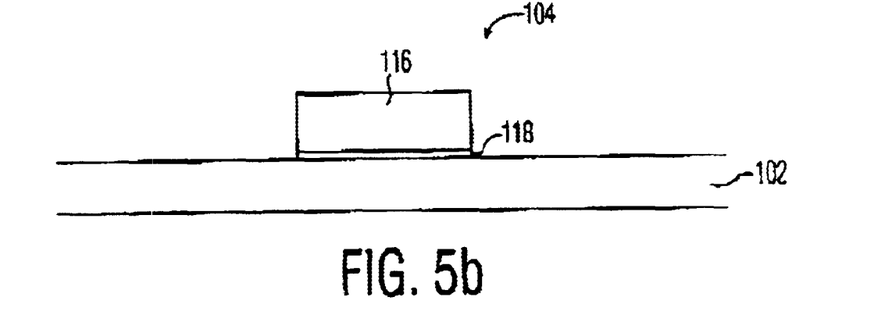
FIG. 5b is a highly exaggerated cross-sectional view of the semiconductor stack of FIG. 5a after etching and removal of the photoresist, wherein a gate is formed in accordance with the embodiment of the present invention set forth in FIG. 4.
Figure 5C:
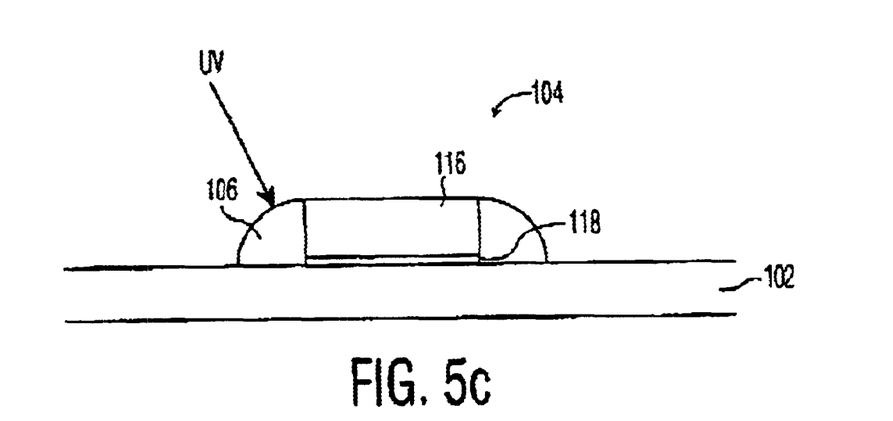
FIG. 5c is a highly exaggerated cross-sectional view of a semiconductor stack of FIG. 5b, wherein a pair of spacers situated adjacent the gate are constructed from a UV radiation blocking material in accordance with the embodiment of the present invention set forth in FIG. 4.

With reference now to FIG. 5c, an alternate embodiment 130 is set forth similar to the embodiment of FIG. 3e with the exception of the UV blocking material 108. Instead, the spacers 106 of the present embodiment are constructed from a UV radiation blocking material 108 for preventing the UV radiation from damaging the gate oxide layer 118 of the gate 104.

Figure 4:
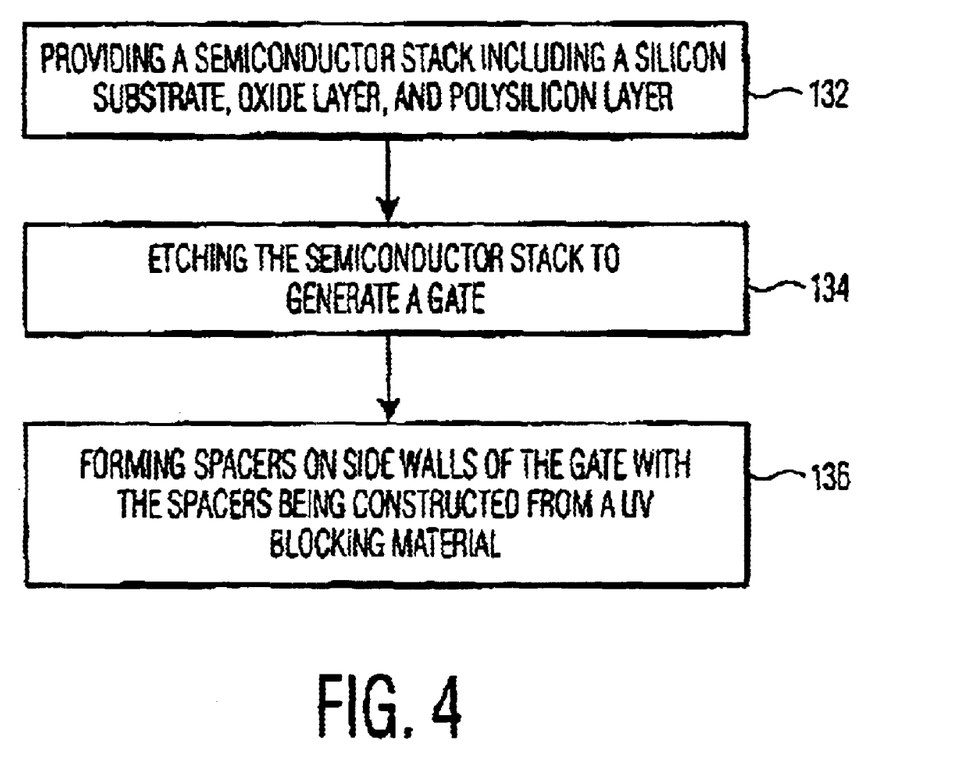
FIG. 4 is a flowchart delineating the method associated with another embodiment of the present invention, wherein spacers that flank the gate are constructed from a UV radiation blocking material.

As shown in FIG. 4, a method is set forth for manufacturing the semiconductor device 100 of the present invention shown in FIG. 5c. As indicated in operation 132 of FIG. 4, a substrate 102 is provided on which a gate material layer 116 and a gate oxide layer 118 are positioned. As shown in FIG. 5a, in preparation of the formation of the gate 104, a photoresist layer 119 is applied to the gate material layer 116 and subsequently patterned.

Etching is then performed to generate the gate 104 that is shown in FIG. 5b, as indicated in operation 134 of FIG. 4. Next, a pair of spacers 106 are positioned on opposite sides of the gate 104, as indicated in operation 136 of FIG. 4. Note FIG. 5c. Such spacers 106 serve not only for insulation purposes, but also to prevent the UV radiation from damaging the gate oxide layer 118 of the gate 104 during later patterning and etching processes. While not shown, it should be noted that at least one metal and intermetal oxide layer 110 may be deposited over the UV radiation blocking material 108 similar to the previous embodiment.

While the UV blocking material 108 may be constructed from any material that is capable of reflecting, impeding, or blocking UV radiation, it may, in one embodiment, take the form of $SiO_xN_y$, including any permutation of x and y. For example, $SiO_{1-10}N_{1-10}$ are possible permutations. In various other embodiments, UV radiation blocking material 108 includes SiN or a Si-rich SiN. It should be noted that Si-rich SiN may be defined as a film where the silicon content exceeds that of stoichiometric $Si_3N_4$, i.e. where SiN>0.75:1. In still yet another embodiment, the UV radiation blocking material 108 may include a multi-layer stack of transparent films. For example, a multi-layer stack of transparent films including $SiO_2$—$TiO_2$—$SiO_2$—$TiO_2$ may be provided.

The fraction of UV radiation penetrating a film of blocking material 108 and reaching an edge of a gate ($I/I_0$) can be estimated using the equation:

$$\frac{I}{I_0} = e^{-\alpha y} \quad \text{[Eqn. 1]}$$

where
I=intensity at the bottom of the blocking layer
$I_0$=intensity at the top of the blocking layer $$\alpha = \text{absorbance} = \frac{4\pi k}{\lambda}$$

k=extinction coefficient
$\lambda$=wavelength (nm)
y=thickness of blocking layer (nm)

Figure 6:
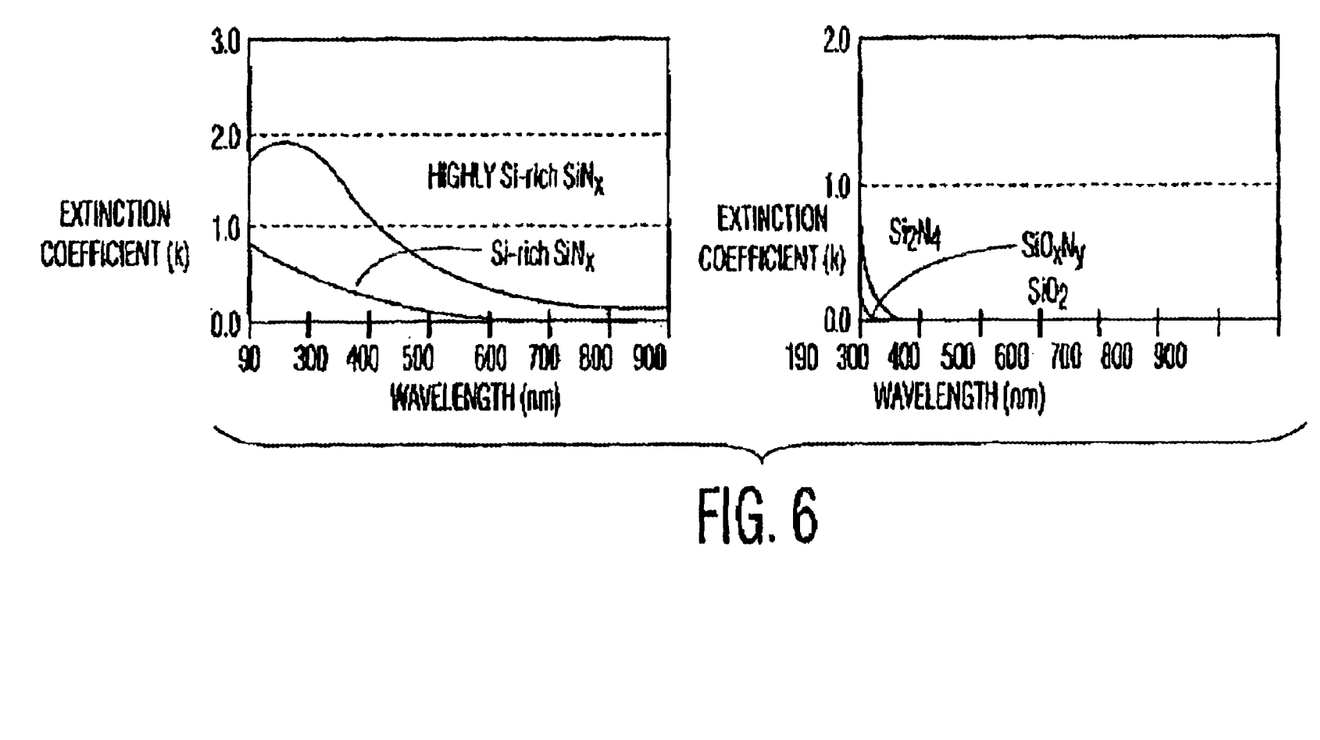
FIG. 6 shows a pair of graphs comparing the extinction coefficients of various materials as a function of wavelength of UV radiation.

Extinction coefficients (k) vs. wavelength are given for various films of interest in FIG. 6 (S. Lian, et al., Semicond. Intl., 21 (8), July 1998, 253). A high k in the low wavelength range is desired for a blocking layer to effectively attenuate UV radiation. As shown, highly silicon-rich nitride is most effective, while $SiO_xN_y$ is less effective.

Figure 7:
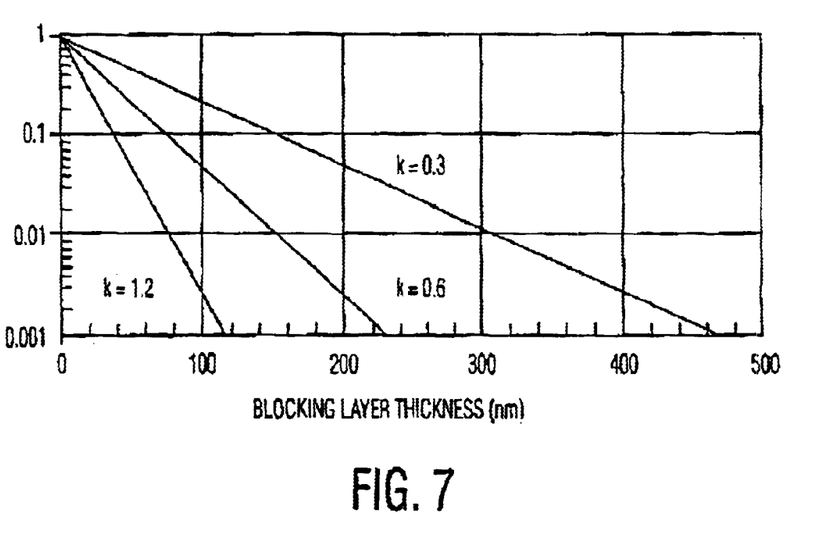
FIG. 7 is a graph comparing the ability of SiON to block UV radiation in terms of the extinction coefficient and thickness of the SiON.

One example of a possible blocking material 108 is SiON with k=0.6 at 248 nm. This is a much higher k than is given in FIG. 6 for $SiO_xN_y$. It should be noted that the silicon content might vary between these films. FIG. 7 shows how one example of SiON and films with lower or higher k values attenuate 248 nm UV radiation, based on Eqn. 1. For the present example of SiON, a thickness of approximately 800 Å is required to block about 90% of the UV, and a thickness of about 1600 Å is required to block 99% of the UV. This range of film thickness is compatible with spacer and IMO layers. Even thinner layers could be used if film deposition are varied to increase Si-richness and thus increase the k value.

Although only a few embodiments of the present invention have been described in detail herein, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A method for forming a semiconductor device on a substrate, comprising:
   forming a gate on the substrate, the gate including a gate material layer and a gate oxide layer positioned between the substrate and the gate material layer, the layers being respectively etched into a stack having sidewalls;
   forming a spacer on each sidewall of the gate; and
   depositing a layer of ultraviolet radiation block material directly over and in contact with the gate material layer and the spacers.

2. The method as set forth in claim 1 wherein the ultraviolet radiation blocking material includes $SiO_xN_y$.

3. The method as set forth in claim 1 wherein the ultraviolet radiation blocking material includes SiN.

4. The method as set forth in claim 3 wherein the SiN includes a Si-rich SiN.

5. The method as set forth in claim 1 wherein the ultraviolet radiation blocking material includes a multi-layer stack of transparent films.

6. The method as set forth in claim 5 wherein the multi-layer stack of transparent films includes $SiO_2$—$TiO_2$—$SiO_2$—$TiO_2$.

7. The method of claim 1 wherein the ultraviolet radiation blocking material absorbs ultraviolet radiation.

8. The method of claim 1 further comprising depositing a layer of ultraviolet radiation block material directly over and in contact with exposed portions of the substrate adjacent to the gate.

9. The method of claim 8 further comprising depositing at least one metal and intermetal oxide layer directly over and in contact with the layer of ultraviolet radiation block material.

10. A method for forming a semiconductor device on a substrate, comprising:

forming a gate on the substrate, the gate including a gate material layer and a gate oxide layer positioned between the substrate and the gate material layer, the layers being respectively etched into a stack having sidewalls; and forming a spacer from an ultraviolet radiation block material on each sidewall of the gate.

11. The method as set forth in claim 10 wherein the ultraviolet radiation blocking material includes $SiO_xN_y$.

12. The method as set forth in claim 10 wherein the ultraviolet radiation blocking material includes SiN.

13. The method as set forth in claim 12 wherein the SiN includes a Si-rich SiN.

14. The method as set forth in claim 10 wherein the ultraviolet radiation blocking material includes a multi-layer stack of transparent films.

15. The method as set forth in claim 14 wherein the multi-layer stack of transparent films includes $SiO_2$—$TiO_2$—$SiO_2$—$TiO_2$.

16. The method of claim 10 wherein the ultraviolet radiation blocking material absorbs ultraviolet radiation.

17. The method of claim 10 further comprising depositing at least one metal and intermetal oxide layer directly over and in contact with the spacers of ultraviolet radiation block material and exposed portions of the substrate.

* * * * *